United States Patent [19]

Martin

[11] Patent Number: 4,469,719

[45] Date of Patent: Sep. 4, 1984

[54] METHOD FOR CONTROLLING THE EDGE GRADIENT OF A LAYER OF DEPOSITION MATERIAL

[75] Inventor: Richard T. Martin, Goleta, Calif.

[73] Assignee: Applied Magnetics-Magnetic Head Divison Corporation, Goleta, Calif.

[21] Appl. No.: 332,497

[22] Filed: Dec. 21, 1981

[51] Int. Cl.³ ............................................. C23C 13/06
[52] U.S. Cl. ..................................... 427/255.5; 427/9;
427/248.1; 427/282; 118/727; 118/720
[58] Field of Search ................ 427/9, 10, 255.5, 255.7,
427/248.1, 282; 118/665, 720, 721, 504, 309, 727

[56] References Cited

U.S. PATENT DOCUMENTS 3,326,718 6/1967 Dill .................................. 427/282 X
4,256,816 3/1981 Dunkleberger .................. 427/282 X
4,301,191 11/1981 Peek .................................. 427/282 X

FOREIGN PATENT DOCUMENTS 41-1209 1/1966 Japan ................................. 427/255.7
978984 1/1965 United Kingdom ................... 427/99

Primary Examiner—John D. Smith
Assistant Examiner—Bernard F. Plantz
Attorney, Agent, or Firm—Daniel J. Meaney, Jr.

[57] ABSTRACT

A method for controlling the slope of the edge gradient of a layer of vapor deposition material onto a substrate from an evaporation source of vapor deposition material comprising the steps of forming a flux of vapor deposition material having an effective source cross-sectional area and shape from an evaporation source of a vapor deposition material located at a known position, indexing a deposition mask having a plurality of apertures extending therethrough such that the mask is in a spaced relationship from the source defining a source-to-mask distance and positioned in the flux of vapor deposition material to permit the flux of vapor deposition to pass through the apertures, registering a substrate in a spaced relationship from the deposition mask defining a mask-to-substrate distance to permit the flux of the vapor deposition material passing through the apertures in the deposition mask to impinge onto the substrate forming a layer of vapor deposit material thereon, controlling at least one of the effective source cross-sectional area and shape of the flux of vapor deposition material, position of the evaporation source of a deposition material relative to the deposition mask, the magnitude of the substrate-to-mask distance and the magnitude of the mask-to-source distance to produce an edge onto the deposited layer of the vapor deposition material having the desired gradient is shown. A product produced by the process is also shown.

19 Claims, 14 Drawing Figures

METHOD FOR CONTROLLING THE EDGE GRADIENT OF A LAYER OF DEPOSITION MATERIAL

BACKGROUND OF THE INVENTION

1. Field of the Invention

This invention relates to a method of utilizing a stabilized mask assembly for use in generation of controlled thin film patterns and more particularly to a method which utilizes a stabilized mask assembly for controlling the edge gradient and position of a layer of vapor deposition material deposited onto a substrate from an evaporation source of vapor deposition material.

2. Description of the Prior Art

Utilization of patterns of thin films in microelectronics is well known in the art. Many methods for generating thin film patterns are known in the art including the use of film deposition masks which are commonly used in an evaporation vacuum deposition process.

Typically, a vacuum deposition mask is fabricated using known etching or electroforming techniques for forming a plurality of apertures in a well-defined pattern. In use, the deposition mask having the well-defined pattern is positioned in close proximity to a substrate upon which a thin film of material formed into the pattern of the well-defined pattern is to be deposited. An evaporant vapor from a vapor deposition source passes through the deposition mask and condenses on the substrate in the form of the well-defined pattern of the deposition mask and wherein the edge gradient is affected by the shadowing effect of the mask to form the thin film layer of material.

In certain of the known prior vacuum deposition processes used for the fabrication of certain electrical components, such as for example, fabrication of thin film transducers, thin film hybrid circuits or discrete electrical components such as helical coils, it is necessary to deposit a plurality of thin film layers of materials in various patterns onto a substrate wherein each deposited layer must be accurately located in an exact position on the substrate and in a predetermined relationship to the prior deposited layers on the substrate.

In connection therewith, it is also know in the art that placing a deposition mask relative to a vapor deposition source in a vapor deposition process results in the mask being subjected to heating due to the type of source being used in the vapor deposition process. Typically, the heat radiated to a mask from a resistively heated boat or crucible type of evaporation source is high. In comparison, the use of an electron beam type of evaporation source results in a lower amount of heat being radiated to a deposition mask.

In the known vapor deposition processes, a deposition mask is subject to heating from at least four (4) possible sources; namely, (a) thermal radiation from the vapor source; (b) heat of vaporization released by the evaporant vapor condensing on the mask itself; (c) the heated substrate and substrate holder located proximate to the deposition mask, and (d) the heated mask support.

The known deposition masks have been formed from metal foil and the so-formed deposition masks are susceptible to changes in operating temperatures during the deposition process. Typically, the metal foil deposition masks have a thin cross-section and as a result thereof, exhibit low conductance of heat and low total heat capacity. As such, the metal deposition mask is highly susceptible to temperature changes resulting from variations in (a) thermal emissivity and thermal conductance due to the presence of evaporation material collected on the mask; (b) heat input to the deposition mask due to variations in the rate of condensation of evaporate material onto the deposition mask; and (c) thermal radiation from the source.

All of the above has the net effect of causing variations in the dimensions of the known deposition mask during the deposition process which results in an inability to precisely control registration and accurate dimensions of the resulting thin film deposited layer or layers.

Further as a result of the deposition mask being exposed to heating, it is known in the art that typically the deposition mask itself expands, the exact amount thereof being determined by the thermal expansion characteristics and the temperature change of the deposition mask itself.

The expansion of the deposition mask is known to have a thermal expansion effect which causes the well-defined pattern to be enlarged due to the expansion of the deposition mask at the operating temperatures of the deposition process.

Descriptions of the prior film deposition through masks and the methods and techniques for fabricating the same are disclosed in greater detail in a book entitled HANDBOOK OF THIN FILM TECHNOLOGY, Edited by Leon I. Maissel and Reinhard Glang, McGraw Hill Book Company, New York, N.Y., 1970, at Chapter 7 thereof entitled "Generation of Patterns in Thin Films" by Reinhard Glang and Lawrence V. Gregor at pages 7-1 to 7-10.

It is known in the art to produce electrical components and circuits from films through the generation of geometrical patterns in the film. A mask is typically used to form the pattern and the use of masks in a deposition process or in an etching process is described at pages 419 to 423, inclusive, in a reference entitled "THIN FILM TECHNOLOGY" by Robert W. Berry, Peter M. Hall and Murray T. Harris, Members of the Technical Staff, Bell Telephone Laboratories, Inc., published by D. VAN NOSTRAND COMPANY, INC. Also, the above reference "THIN FILM TECHNOLOGY" discloses at pages 451 to 453, inclusive, the use of a mechanical mask in a vacuum evaporation process to provide deposited layers in patterns which are within ±0.002 inches of the mechanical mask pattern with the capability of obtaining tolerances in the order of ±0.002 inches. At page 452 of the reference "THIN FILM TECHNOLOGY", a process is described which utilizes a deposited photoetched film positioned on a substrate as a deposition mask to produce a deposited pattern having a sharp edge definition.

One technique using a vapor deposition process including deposition through a deposition mask is disclosed in U.S. Pat. No. 3,867,368 to Lazzari. In fabrication of a thin film transducer having pole piece layers and one or more winding layers, any one of several techniques can be used in an attempt to precisely control the width, length, depth and registration of the various layers relative to the prior deposited and post deposited layers. The apparatus utilized in fabricating such thin film transducers relied solely on the use of mask-carriage assembly which functionally attempted to index and accurately position a specific deposition mask pattern relative to a substrate.

One known vapor deposition process which utilized a deposition mask having a circular aperture for evaporating an electrode of gold or silver in a small circular area which produced a sharply defined small central area of deposited material forming an electrode on a base coated electrode of a high frequency crystal to calibrate the same is disclosed in an article entitled "The Deposition of Electrode onto Crystal Vibrators" which appeared on pages 264 to 268, inclusive in a reference known as "Vacuum Deposition of Thin Films" by L. Holland, 1963, published by Chapman and Hall, Ltd., 37 Essex W.C.

In a process described in an article entitled "THINCO'S UNIQUE VACUUM DEPOSITION SYSTEM" which appeared at page 11 et seq in the June, 1980 issue of "r.f. design", a Cardiff Publication, electronic components were produced by sequential deposition of metal and dielectric films through aperture masks. As noted in the above identified article, a variety of masks with precision apertures and precision mask indexing were utilized. The articles included a FIG. 6 which illustrated one of six masks having a plurality of semi-circular apertures used for the fabrication of a thin film, a multi-layer inductor. The mask indexing and registration apparatus or the method for accomplishing the same was not disclosed. The article noted that how small the size of the apertures can be made with precision tolerances depends on several factors including the mask thickness. The sizes of aperture diameters obtained were in the order of 0.005 inches.

The use of photo resist material as a mask in an ion milling application is disclosed in U.S. Pat. No. 4,119,881. The ion beam source was produced by use of grids positioned in the form of a "truncated cone".

The use of electron-sensitive, two level resist to produce a mask for use in a vapor deposition process is also known in the art. In one known application, a Josephson junction was fabricated by use of a two-level, electron sensitive resist to produce a self-aligning deposition mask utilized in conjunction with an effective evaporation source. The use of electron-sensitive, two-level resist was disclosed in an article entitled "Submicron Tunnel Junction At Bell Labs", which appeared in the July, 1981 issue of "Semiconductor Industry" at pages 9 and 10.

In the above disclosed technique, a base electrode was evaporated at an oblique angle to a substrate through a pattern mask formed in the two-level resist. The deposition mask was fabricated using electron-lithography techniques with a two-level electron sensitive resist to produce a severely undercut lower support layer in one level of the resist, which was contiguous the substrate, to define an electrode deposition area on the substrate. The other upper level of the resist produced a second spaced, upper supported resist layer which overhangs the support layer and has a pattern formed therethrough adjacent the electrode deposition area. The upper resist layer formed a suspended resist span which defined a deposition mask having a specific pattern for a counter electrode. A base electrode of lead-indium (Pb In) alloy was evaporated at an oblique angle to the substrate on the side of the deposition mask opposite to the counter electrode section, through the patterned resist. The base electrode was then oxidized and a counter electrode of lead (Pb) was deposited from an oblique angle on the other side of the deposition mask having the counter electrode pattern. The counter electrode was deposited in an overlap pattern onto the base electrode. The resulting super conducting junctions were formed in the overlap areas of the Lead Indium-Oxide to Lead layers. The base electrode was less than 0.05 micrometers thick.

SUMMARY OF THE INVENTION

The present method discloses a novel, unique and new method for controlling the slope of the edge gradient of a layer of vapor deposition material deposited onto a substrate from an evaporation source of vapor deposition material. The method includes the step of forming a flux of vapor deposition material having an effective source cross-sectional area and shape located at a known position, emanating from an evaporation source of a vapor deposition material; indexing a deposition mask having a plurality of apertures extending therethrough which define a pattern for a layer of vapor deposition material to be deposited onto a substrate such that the deposition mask is in spaced relationship from the source of vapor deposition material defining a source-to-mask distance and positioned in the flux of vapor deposition material to permit selected portions of the flux vapor deposition material to pass through the apertures of the vapor deposition mask. The method then includes the step of registering a substrate in a spaced relationship from the deposition mask defining a mask-to-substrate distance to permit the selected portions of the flux of vapor deposition material passing through the apertures in the deposition mask to impinge onto the substrate to form a layer of vapor deposition material thereon having a pattern which is defined by the apertures in the deposition mask, the substrate-to-mask distance, the mask-to-source distance and the effective source cross-sectional area and shape producing the flux of vapor deposition material. The method includes the step of controlling at least one of the effective source cross-sectional area and shape at the source of flux of vapor deposition material, position of the evaporation source of vapor deposition material relative to the deposition mask, the magnitude of the substrate-to-mask distance and the magnitude of the mask-to-source distance to direct the selected portions of the flux of vapor deposition material through each aperture at a predetermined shift displacement onto the substrate. By utilizing the method included in the above steps, a variable flux density of vapor deposition material at the surface of the substrate is produced which defines edges on the layer forming the pattern which extends from the extremities of the layer defining the pattern to the central portion of the layer defining the pattern wherein the thickness of the deposited layer of vapor deposition material decreases from the central portion of the layer to the extremities of the layer in a predetermined gradient which varies the edge gradient of the deposited layer to produce an edge on the deposited layer of vapor deposition material having the desired edge gradient.

None of the known prior art methods for depositing a layer of vapor deposition material onto a substrate discloses a method for precisely controlling the slope of the edge gradient of the layer of vapor deposition material formed on a substrate. In a multulayer deposition process, the slope of the edge gradient becomes critical to insure that sufficient step coverage thicknesses of vapor deposition material are obtained on subsequent overlapping layers or to insure that edges of subsequent stacked layers have sufficient edge coverage thickness.

One advantage of the present invention is that one or more layers of vapor deposition material can be produced wherein the slope of the edge gradient of each of the layers of vapor deposition material can be precisely controlled.

Another advantage of the present invention is that by controlling the mask-to-substrate distances the secondary effects due to atoms or molecules of vapor material bouncing from the surface of the substrate onto the mask and by subsequent bouncing thereof from the mask back onto the substrate, the effect of which is to have a tendency to feather out or make a very thin layer of deposit material extending beyond the nominal gradient of the deposited layer, can be compensated for in determining the slope of the edge gradient of a layer of deposited material. This has a particular advantage as a means for preventing shorts from occurring in adjacent, overlapping or stacked spaced layers formed of a metal material.

A further advantage of the present invention is that the position of the source relative to the mask which determines the mask-to-source distance can be selected to obtain the desired slope of the edge gradient of a layer of deposited material.

A yet further advantage of the present invention is that the mask-to-source distance can be fixed and by laterally shifting the source relative to the mask while maintaining the nominal distance therebetween, the location of the edge gradient and its deposited layer can be precisely controlled.

Yet a further advantage of the present invention is that the cross-sectional area and shape of the effective source can be controlled to produce a deposited layer wherein the effective length of the effective source in a first direction is greater than the effective width of the effective source in a second direction which is substantially perpendicular to the first direction to produce a deposited layer of material in a pattern having a slope of the edge gradient in the first direction at a first selected slope which is less than the slope of the edge gradient in the second direction which is a second selected slope.

A still yet further advantage of the present invention is that the effective source can be enlarged or reduced in size in a selected direction to decrease or increase, respectively, the slope of the edge gradient in the varied direction.

BRIEF DESCRIPTION OF THE DRAWING

The foregoing and other advantages and features of this invention will be apparent from the following description of the preferred embodiment when considered together with the illustrations in the accompanying drawing which include the following figures.

DESCRIPTION OF THE PREFERRED EMBODIMENT

Before commencing with a detailed description of the preferred embodiment, an understanding of the prior art deposition techniques and the effects imposed on the edge gradient of a deposited layer arising from the effects of a warping mask and lateral shifting of the mask, substrate and effective source relative to each other will be first discussed.

Figure 1A:
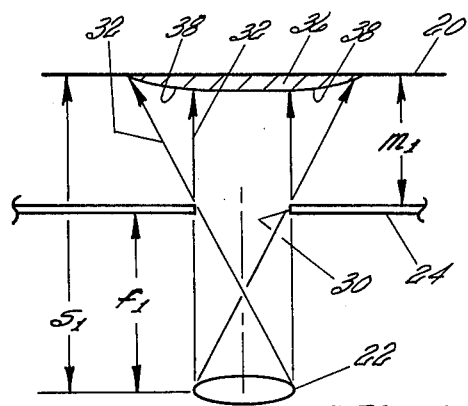
FIGS. 1(a) and 1(b) illustrate the gradient of the edge of a vapor deposited layer produced using known techniques wherein the source-to-substrate distance remains fixed and the mask-to-substrate distance is at a predetermined value in FIG. 1(a) and varies from that value in FIG. 1(b)
Figure 1B:
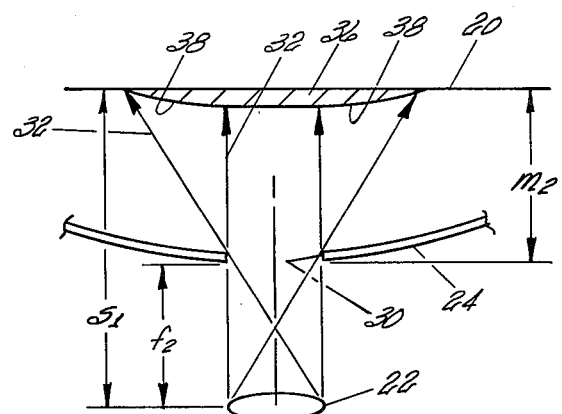

Referring to FIG. 1(a), a substrate 20 is positioned a fixed distance $s_1$ from an effective source 22. Also, a substrate 20 is fixed at a predetermined distance $m_1$ from a mask 24. The mask 24 has an aperture 30 formed therein which is adapted to pass lines of flux 32 from the source 22 to produce a deposited layer 36 on substrate 20. The deposited layer 36 has an edge gradient illustrated as 38 which is produced by the edge of aperture 30 of the mask 24 causing a graded "shadowing effect" of the source by intercepting lines of flux from some areas of the effective source while permitting lines of flux from the remaining areas of the effective source to pass unintercepted through the aperture 30 onto a substrate 20. The slope of the edge gradient 38 is determined by a number of factors including the mask-to-source distance $f_1$, the mask-to-substrate distance $m_1$, and the cross-sectional area of the effective source 22. FIG. 1(b) illustrates the effect on the deposited layer 36 due to the warping of mask 24. The mask 24 is illustrated in FIG. 1(b) such that the mask warps in a direction to transpose the aperture 30 a further distance $m_2$ from the substrate 20 which results in the lines of flux 32 from the effective source 22 passing through the aperture 30 and causing the width of the edge gradient 38 to become wider thereby reducing the angle of slope thereof. The effective mask-to-substrate distance is changed from $m_1$ illustrated in FIG. 1(a) to $m_2$ illustrated in FIG. 1(b).

FIGS. 1(a) and 1(b) are a comparison showing the effect of variation in the edge gradient due to the variation in the mask-to-substrate distances.

Figure 2A:
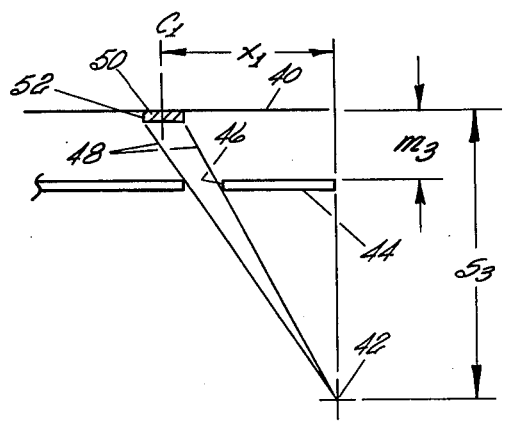
FIGS. 2(a) and 2(b) pictorially illustrate the prior art effect of varying mask-to-substrate distance while maintaining a fixed substrate-to-source distance which produces a lateral shift of the vapor deposited layer.

FIG. 2(a) illustrates diagrammatically a substrate 40 which is positioned at a fixed substrate-to-source distance $s_3$ and which is spaced from a mask 44 having an aperture 46 formed therein and a mask-to-substrate distance $m_3$. The effective source 42 through its lines of flux 48 deposit a layer 50 onto the substrate 40. This is an idealized case using a point source as the effective source to illustrate the lateral shift phenomenon and the slope of the edge gradient is not illustrated for this purpose. The center line of the deposited layer, designated as $c_1$, is at a distance $x_1$ from the center line of the effective source 42.

Figure 2B:
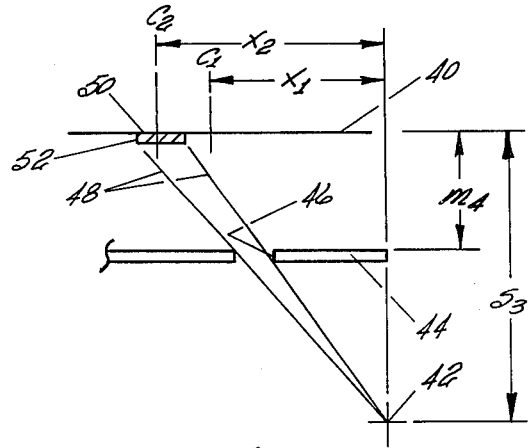

FIG. 2(b) illustrates the effects of increasing the mask-to-substrate distance between mask 44 and substrate 40 to a distance shown as $m_4$. The effect is to transpose the aperture 46 a greater distance $m_4$ from the substrate 40 which causes the unintercepted lines of flux 48 to be directed along a path to deposit the layer 50 with the center line $c_2$ of the layer 50 located a distance $x_2$ from the center line of the source 42. The original center line $c_1$ and the original distance $x_1$ of the layer 50 from the center line of source 42 is likewise shown in FIG. 2(b).

FIGS. 2(a) and 2(b) are a comparison showing the effect of a lateral shifting of an off axis deposited pattern due to the variation in the mask-to-substrate distance.

Figure 3A:
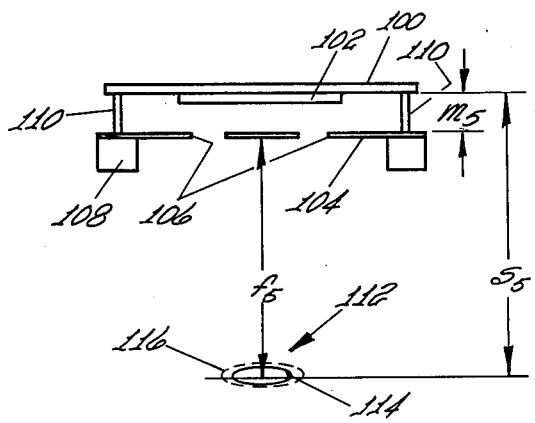
FIGS. 3(a) and 3(b) illustrate pictorally an arrangement wherein the mask-to-substrate distance varies and the mask-to-source distance is fixed.
Figure 3B:
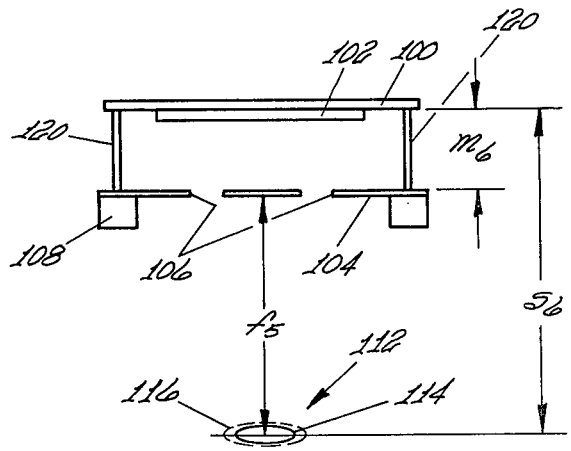

FIGS. 3(a) and 3(b) illustrate diagramatically apparatus which is capable of carrying out the method of the present invention. The apparatus includes a substrate support holding means 100 which supports a substrate 102 at a predetermined distance from a mask 104 having apertures 106 formed therein. The mask 104 is supported by a mask supporting frame 108. Alignment pins 110 are utilized to fix the mask-to-substrate distance, designated as $m_5$, FIG. 3(a), at a predetermined distance which spaces the substrate 102 a predetermined distance from the mask 104. The source 112 having an effective cross-sectional area shown by solid line 114 has a fixed source-to-mask distance shown as $f_5$. Thus, the substrate 102 is positioned at a predetermined fixed distance $m_5$ from the mask 104. Thus, by fixing the substrate 102 to mask 104 distance, as shown by $m_5$, and fixing the substrate to source distance $f_5$, the mask-to-source distance $s_5$ is likewise fixed.

In substance, by controlling the variables which include at least one of the cross-sectional area and shape of the effective source 112, the mask-to-substrate distance and the mask-to-source distance, the edge gradient characteristics of the deposited layer can be precisely controlled. For purposes hereof, the term "controlling" is intended to include varying the above variables, fixing one or more of the variables at a predetermined condition or any combination of the above. Also, for purposes hereof, the term "cross-sectional area and shape" is the minimum area and shape of that area, respectively, from which the lines of flux of deposition material from an evaporating source appear to emanate.

As illustrated in FIG. 3(a), the cross-sectional area of the source can be varied and can be increased as illustrated by 116 or can be decreased to a smaller cross-sectional area than that shown by solid line 114.

FIG. 3(b) shows one method of decreasing the angle of the slope of the edge gradient by increasing the mask-to-substrate distance $m_6$. This can be accomplished by use of longer pin members 120 which cooperate with the mask supporting frame 108. As illustrated in FIG. 3(b), the substrate-to-mask distance is increased to a distance shown by $m_6$. Similarly, the distance from the substrate 102 to source 112 is increased to a distance shown by $s_6$. However, the mask-to-source distance remains the same as shown by distance $f_5$. By varying the mask-to-substrate distance $m_6$ as illustrated in FIG. 3(b), a different edge gradient characteristic can be obtained, the exact angle thereof being a function of the cross-sectional area of the affected source and the distance between the mask-to-substrate illustrated by $m_6$ and the distance $f_5$ between the mask 104 and the effective source 114.

Figure 4:
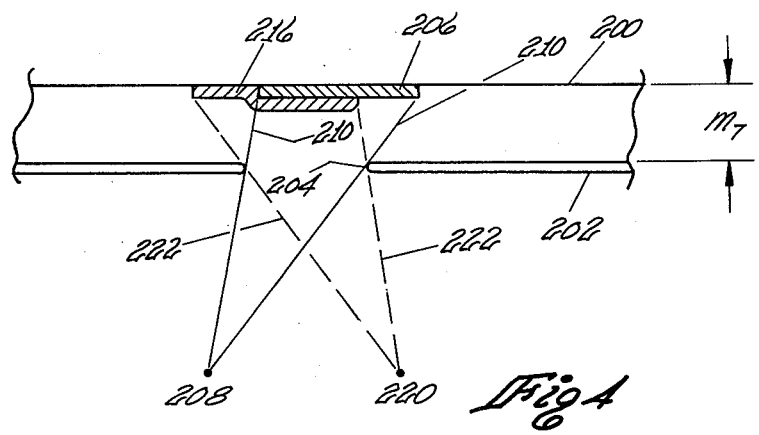
FIG. 4 illustrates pictorally the effect of laterally shifting the position of the effective source point relative to a deposited layer on a substrate to deposit a second, laterally shifted layer.

FIG. 4 illustrates pictorally a method for utilizing the lateral shifting of a source relative to the mask 202 and substrate 200 to control the lateral displacement of the first layer 206 relative to a second layer 216 on a substrate 200. Again, this is an idealized case and the illustration set forth herein is to show the effect of a lateral shift of the effective source relative to a mask wherein the mask-to-substrate distance $m_7$ is fixed and the effect on the slope of the edge gradient is not illustrated for this purpose.

In FIG. 4, the substate 200 is spaced a predetermined distance $m_7$ from a mask 202. A first layer 206 of vapor deposited material is deposited onto the substrate 200 from an effective source 208. The lines of flux of vapor of deposition material from the effective source 208, which is illustrated for purposes of example as a point source, is illustrated by lines 210 to deposit the first layer 206.

A second layer 216 is deposited onto substrate 200 by laterally shifting the effective source, which in this illustration is a point source, to position 220 or by using a different effective source located at position 220. The lines of flux from effective source 220 illustrated by dashed lines 222 deposit the second layer 216.

Figures 5A, 5B:
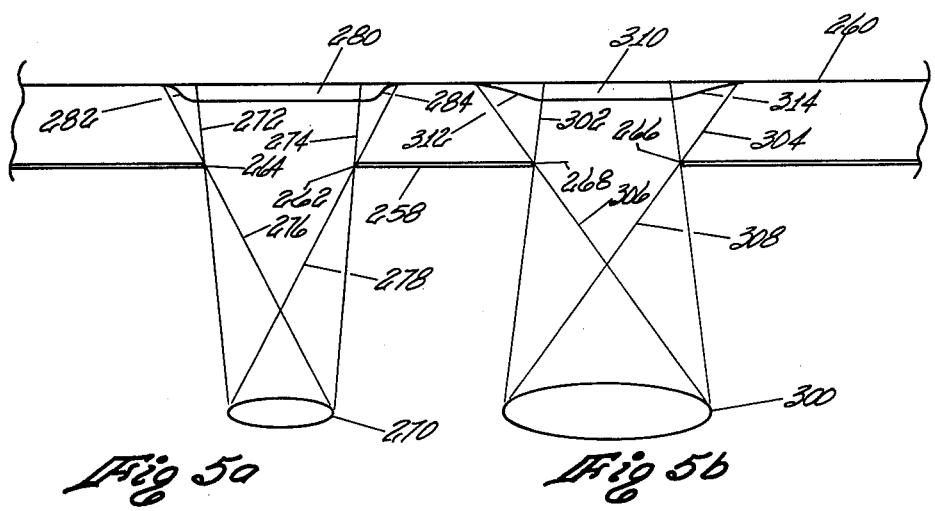
FIGS. 5(a) and 5(b) illustrate the slope of the edge gradient of a deposited layer which is determined by varying the area and the shape of the effective source.

FIGS. 5(a) and 5(b) show the effect on the edge gradient of the deposited layer by controlling the effective source cross-sectional area and/or shape of a flux of vapor deposition material.

Referring to FIGS. 5(a) and 5(b), an effective source 270 has a predetermined cross-sectional area and shape. The distribution of the flux of vapor deposition material passing through the mask apertures, one of which is defined by edges 262 and 264 and the other of which is defined by edges 266 and 268, can be controlled by varying the effective source cross-sectional area as illustrated by the differences between 270 in FIG. 5(a) and 300 in FIG. 5(b). By varying the effective source cross-sectional area and/or shape, the shape of the edge gradient of the deposited layer can be controlled. Referring specifically to FIG. 5(a), the lines of flux illustrated by 272 and 276 represent the shadowing of effective source 270 caused by the left edge 264 defining the aperture which produces the edge gradient 282 on the left side of deposited layer 280. Likewise, lines of flux 274 and 278 represent the shadowing of effective source 270 caused by the right hand edge 262 defining the aperture which produces edge gradient 284 on the right side of deposited layer 280. Thus all of the lines of flux represented by lines 272, 274, 276 and 278 traverse the edges 262 and 264 defining an aperture mask 258 to deposit the flux of vapor material onto the substrate 260 forming the vapor deposited layer 280. The vapor deposited layer 280 has an edge gradient which has a slope as indicated by edges 282 and 284. The slope of the edge 282 is determined by the uninterrupted lines of flux 272 and 276 which pass by edge 264 and are deposited in a sloped gradient onto the substrate 260. The factors which determine the geometrical relationship between the illustrative lines of flux 272 and 276 and resulting slope gradient are controlled by the three variables: namely; the mask-to-substrate distance, the mask-to-source distance and the effective source cross-sectional area and/or shape.

FIG. 5(b) illustrates the results and the effect of increasing the effective source cross-sectional area and shape to produce a different slope of the edge gradient of a deposited layer 310. Lines of flux illustrated by 302 and 306 represent the shadowing effect of effective source 300 caused by the left side 268 defining the aperture in mask 258 which produces edge gradient 312 on the right side of deposited layer 310. Likewise, lines of flux 304 and 308 represent the shadowing of effective source 300 caused by the right hand edge 266 defining the aperture which produces edge gradient 314 on the right side of deposited layer 310. In a manner similar to that discussed in connection with FIG. 5(a), and for the same reasons set forth therein, the geometrical relationship between the illustrated lines of flux 302 and 306 for edge 312 and lines of flux 304 and 308 for edge 314 defines the slope or gradient of the deposited layer 310.

Thus, by increasing the effective cross-sectional area, which can be accomplished in either a first direction or second direction or equally in all directions, the characteristics and slope of the edge gradient of the deposit layer can be precisely controlled.

Figure 6:
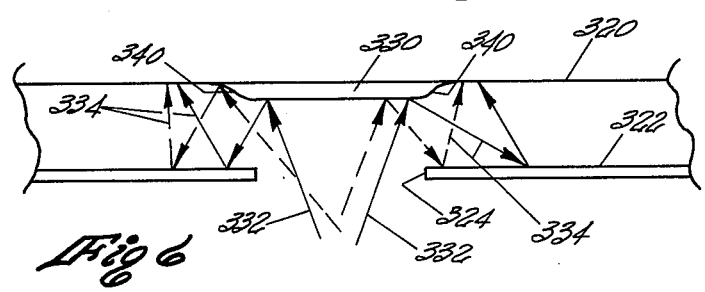
FIG. 6 is a pictoral representation of the secondary bounce effect of atoms or molecules of vapor material which are reflected from the substrate and mask at different angles of bounce.

FIG. 6 shows a secondary phenomenon which must be taken into account in determining the spatial area on the substrate affected by the deposit. In FIG. 6, a substrate 320 is spaced a selected distance from a mask 322 having an aperture 324 formed therein. Flux lines 332 from a source of vapor deposition material traverse through aperture 324 in a manner as described in connection with FIGS. 5(a) and 5(b). The lines of flux deposit the material onto the substrate 320. Typically, a small fraction or proportion of the atoms or molecules of deposition material do not adhere to the substrate 320 or the deposited layer 330 formed thereon. Some atoms or molecules of vapor deposition material bounce from the substrate and from the deposited layer at a random angles referred to herein as the "secondary bounce effect". The proportion of atoms or molecules which adhere to the substrate or mask depend on a number of factors such as energy level of the atoms or molecules, the temperature of the mask and substrate surface and other factors. The end result is that by the secondary bounce effect a secondary level of deposition material ultimately traverses to the back side of mask 322 and by another bounce to the substrate 320, the effect of which is to have a tendency to feather out or make a very thin layer of deposited material extending beyond the nominal edge gradient shown as 340 of the deposited layer 330. In determining the overall area which receives deposited material, some adjustment must be made for the secondary bounce effect of the atoms and molecules as illustrated in FIG. 6. The substrate-to-mask distance must be well controlled in order to insure that the secondary bounce effect and the resulting feathering out of the deposited material is predictable.

Figure 7:
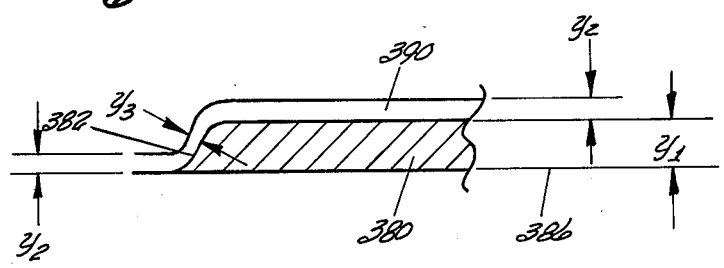
FIG. 7 is a pictoral representation, partially in cross-section, showing the profiles of the step coverage of a top layer overlapping a bottom layer.

FIG. 7 illustrates diagrammatically a method for depositing a second layer 390 of material onto a first layer 380 of material and over one of the edges 382 of the first layer 380. The area or section where the second deposited layer 390 traverses the edge 382 of the first layer 380 is referred to as the "step coverage". As illustrated in FIG. 7, the thickness of deposited layer 380 is shown as "$Y_1$" and the thickness of the second deposited layer 390 is shown as "$Y_2$". In the example, "$Y_1$" is greater than "$Y_2$".

At the area where the second deposited layer 390 passes over the steepest portion of the edge gradient of the first layer 380, which is the edge 382, the overall thickness of the second deposited layer 390 is reduced in thickness at the point shown by the arrows representing the dimension "$Y_3$". The thickness of the second deposited layer 390 at the point where it returns to the substrate 386 is again the thickness "$Y_2$".

This "step coverage" effect is important because in the fabrication of electrical components, the thickness "$Y_3$" of the second deposited layer 390 may be critical. Examples of where the thickness of the second deposited layer at the section where the "step coverage" occurs is important are where the second deposited layer is to be a current carrying layer, a magnetic flux carrying layer or an insulating layer. Other applications exist where a second layer of deposited material must have a minimum thickness. The method to control the relative thinning of the upper layer going over the step or edge of the lower layer is to control the slope of the edge gradient 382 of the lower or first deposited layer 380.

Figure 8:
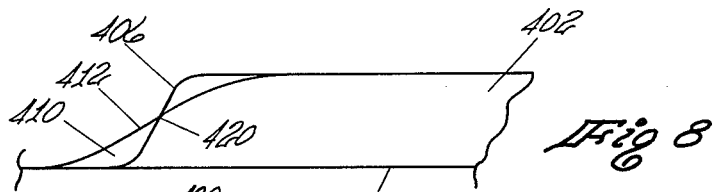
FIG. 8 is a pictoral representation illustrating the distributions of the gradients of two different layers superimposed on each other showing the variation of the edge gradients of the two layers wherein the slope thereof can be varied by any or more of the means described herein.

FIG. 8 illustrates diagramatically superposition of two layers with different slopes which could be produced utilizing a common mask by varying one or more of the parameters discussed herein; namely, mask-to-substrate distance, mask-to-source distance and effective source cross-sectional area and/or shape. For purposes of clarification, a substrate 400 has a first layer 402 deposited thereon which has an edge gradient 406 having a steep slope as illustrated in FIG. 8. For purposes of illustration only, if a second layer was deposited onto the substrate 400 in the same position as the first layer, that second layer, illustrated as 410, would have a much gentler slope as illustrated by edge 412. It is readily apparent that the steep slope and the gentle slope have a point in common illustrated as point 420 which is typically the inflection point of the slope and is typically at one-half the full thickness of the layer.

Figure 9:
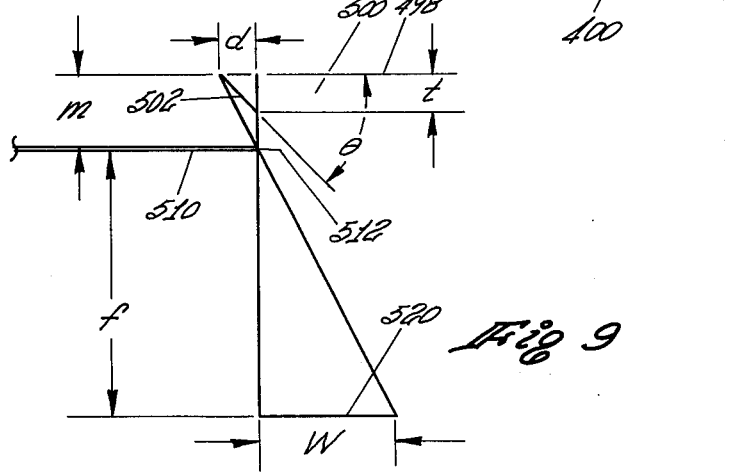
FIG. 9 is a pictoral representation which illustrates the angle of deposit $\theta$ of the edge gradient of a layer which is established by a selected mask-to-source distance; a selected effective source size and a selected mask-to-substrate distance.

FIG. 9 illustrates diagramatically the variables which can be controlled to determine the angle $\theta$ which is the nominal angle of slope of the edge gradient. FIG. 9 illustrates that a deposited layer 500 would have a certain thickness "t" and would have an edge gradient 502 which has an angle $\theta$ measured relative to the surface of substrate 498. The effective lateral width of the sloped edge gradient is defined as the distance between the point where the surface of the layer begins to slope towards the substrate 498 and the point where the outer surface of the layer defining the edge intersects the substrate 498. This effective lateral width is designated as "d" in FIG. 9.

A mask 510 has one edge thereof 512 which defines one side of an aperture. The distance between the mask 510 and a substrate 498 is illustrated as "m". The distance between the mask 510 and a source 520 as illustrated by distance "f". The effective cross-sectional width of the effective source cross-sectional area is illustrated as "W".

Based on the above, the following formula can be generated to represent angle $\theta$ as a function of the substrate-to-mask distance m, the mask-to-source distance f, deposited layer thickness t and the effective cross-sectional width of the source W. The following formula (1) is applicable to determine the angle $\theta$:

$$\theta = \text{ARC TAN}\left(\frac{tf}{Wm}\right) \quad (1)$$

Figure 10:
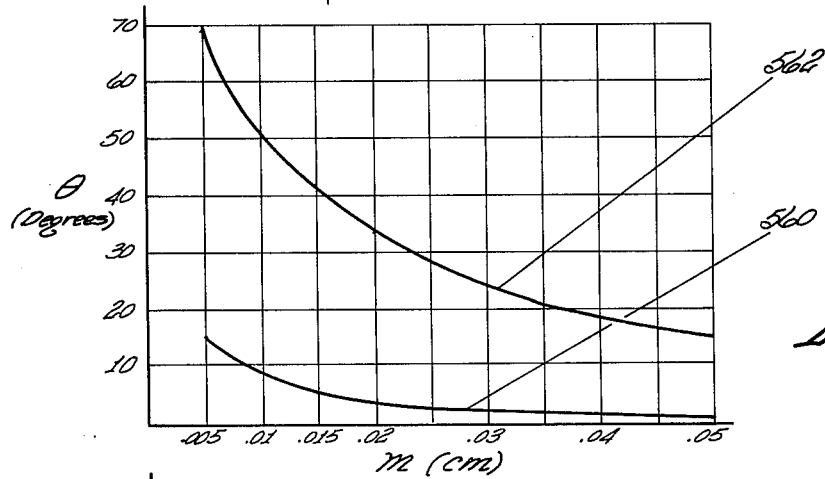
FIG. 10 is a graph which plots the angle $\theta$ of the edge gradient for two thicknesses of deposited layers for the edge gradient illustrated in FIG. 9 wherein the mask-to-source distance if fixed, the effective source size is fixed and the mask-to-substrate distance is a variable.
Figure 11:
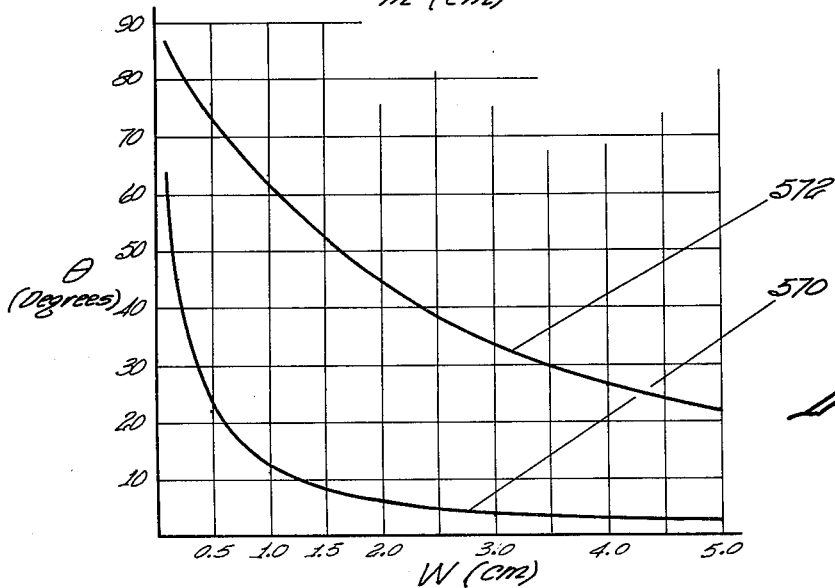
FIG. 11 is a graph which plots the angle $\theta$ of the edge gradient for two thicknesses of a deposited layer of the edge gradient illustrated in FIG. 9 wherein the mask-to-source distance is fixed, the mask-to-substrate distance is fixed and the effective source size is a variable.

FIGS. 10 and 11 are graphs representing the plotting of the angle $\theta$ as a function of a number of variables as illustrated in FIG. 9. Specifically, FIG. 10 is the plot of the angle $\theta$ of the edge gradient plotted as a function of varying the substrate-to-mask distance m with the mask-to-source distance f and the effective cross-sectional size of the source W fixed. In FIG. 10, the mask-to-source distance f was fixed at 40 cm and the effective source width W was fixed at 3 cm. The independent variable is the mask-to-substrate distance m. Curve 560 is a plot of the angle $\theta$ of the edge gradient verses the mask-to-substrate distance m for a deposited layer having a thickness t equal to $10^{-4}$ cm (10,000 Angstroms).

The second curve 562 is a plot of the angle $\theta$ for the same conditions where the thickness t of the deposited layer is $10^{-3}$ cm (100,000 Angstroms). Based upon the curves illustrated in FIG. 10, it is readily apparent that the desired angle $\theta$ of the edge gradient can be selected as a function of thickness t of the deposited layer by controlling the substrate-to-mask distance m.

FIG. 11 illustrates the angle $\theta$ which is the angle of the slope of the edge gradient plotted for two layers wherein the source width W is varied and the substrate-to-mask distance m and the mask-to-source distance f is fixed. In FIG. 11, the substrate-to-mask distance is fixed at 0.02 cm and the mask-to-source distance is fixed at 40 cm. Curve 570 is a plot of the angle $\theta$ which is the angle of the slope of the edge gradient for a thickness of the deposited layer which is equal to $10^{-4}$ cm. Curve 572 is a plot of the angle of the edge gradient for a deposited layer having thickness of $10^{-3}$ cm. Based upon the curves illustrated in FIG. 11, as the thickness of the deposited layer increases, the angle of the edge gradient would likewise increase significantly. However, by varying the cross-sectional width W of the effective source, the angle $\theta$ can be varied over a wide range of angles as illustrated in FIG. 11. Likewise, with the thicker deposited layer, the angle $\theta$ of the edge gradient can be increased from a sharper angle which approaches 87° down to an angle which has a relatively small slope in the order of 22°.

Based on the above, the teachings of the apparatus method set forth herein can be utilized for controlling the edge gradient of a layer of vapor deposit material deposited onto a substrate from an evaporation source of vapor deposition material.

A method for controlling the edge gradient of a layer of vapor deposition material deposited onto a substrate from an evaporation source of vapor deposition material is an integral part of the teachings of this invention. In the preferred embodiment, the method comprises the steps of forming a flux of vapor deposition material having an effective source cross-sectional area and shape located at a known position from an evaporation source of a vapor deposition material; indexing a deposition mask having a plurality of apertures extending therethrough which define a pattern for a layer of vapor deposition material to be deposited onto a substrate such that the deposition mask is in a spaced relationship from the source of vapor deposition material defining a source-to-mask distance and positioned in the flux of vapor deposition material to permit selected portions of the flux of vapor deposition material to pass through the apertures in the deposition mask; registering a substrate in a spaced relationship from the deposition mask defining a mask-to-substrate distance to permit the selected portions of the flux of vapor deposition material passing through the apertures in the deposition mask to impinge onto the substrate to form a layer of vapor deposited material thereon having a pattern which is defined by the apertures in the deposition mask, the substrate-to-mask distance, the mask-to-source distance and the effective source cross-sectional area and shape producing the flux of vapor deposition material; and controlling at least one of the effective source cross-sectional area and shape of the flux of vapor deposition material, position of the effective source of vapor deposition material relative to the deposition mask, the magnitude of the substrate-to-mask distance and the magnitude of the mask-to-source distance to direct the selected portions of said flux of vapor deposition material through each aperture at a controlled shift displacement onto the substrate forming a variable flux density of vapor deposition material at the surface of the substrate to define edges on the layer forming the pattern which extend from the extremeties of the layer defining the pattern to the central portion of the layer defining the pattern wherein the thickness of the deposited layer of vapor deposition material decreases from the central portion of the layer to the extremeties of the layer in a controlled gradient which varies the edge gradient of the deposited layer to produce an edge on the deposited layer of vapor deposition material having a desired edge gradient.

Based upon the illustrations in FIGS. 5(a) and 5(b) and the graph of FIG. 11, it is possible to vary the area and shape of the effective source, such that the effective length thereof in the first direction is greater than the effective width thereof in a second direction which is substantially perpendicular to the first direction. This results in a deposit layer of material having a pattern wherein the slope of the edge gradient in the first direction is at a first-selected slope which is less than the slope of the edge gradient in the second direction which is a second-selected slope. Also, it is envisioned that the step of varying at least one of the cross-sectional area and shape of the effective source such that the effective length thereof in a first direction is greater than the effective width thereof in a second direction which is substantially perpendicular to the first direction to produce a deposited layer of material in a pattern having the slope of the edge gradient in the first direction at a first slope which is less than the slope of the edge gradient in the second direction which is a second slope. The step of varying at least one of the effective source cross-sectional area and shape may include the step of enlarging the effective source cross-sectional length in one of the first direction and the second direction to decrease the slope of the edge gradient in the enlarged direction and reducing the effective source cross-sectional width in the other of the first direction and second direction to increase the slope of the edge gradient in the reduced direction. This method can be used to produce a unique pattern wherein edge gradients can have different slopes in the different directions.

The method disclosed herein has particular utility in the fabrication of thin film components for fabricating electrical components. By use of masks having different patterns therein, and by controlling the thickness of various deposit layers and the position of layers relative to each other deposited onto a substrate, electrical components, such as thin film magnetic transducers, magnetoresistive transducers, inductors, capacitors, and other components can be fabricated with a high degree of precision and with specific electrical characteristics.

What is claimed is:

1. A method for controlling the edge gradient of a layer of material deposited through a preformed mask onto a substrate wherein the substrate-to-mask distance is fixed comprising the steps of forming a flux of material to be deposited onto a said substrate wherein the flux of material has a distribution characteristic along a plurality of predetermined paths emanating from at least one source having a known cross-sectional area and shape and located at a selected source position wherein the mask-to-source distance is fixed;

aligning a preformed mask having a plurality of apertures extending therethrough which define a pattern for the layer of material to be deposited onto a said substrate such that the preformed mask is in a spaced relationship from a said at least one source of the flux of material located at said selected source position defining a mask-to-source distance and positioned in said flux of material to permit selected portions of said flux of material along the predetermined paths to pass through said apertures in the preformed mask;

registering a substrate in a spaced relationship from the preformed mask defining a mask-to-substrate distance to permit the selected portions of said flux of material passing through the apertures in said preformed mask to impinge onto said substrate to form a layer of material thereon having a pattern defined by the apertures in said preformed mask, the substrate-to-mask distance, the mask-to-source distance and the cross-sectional area and shape of the effective source producing the flux of material;

controlling the cross-sectional area and shape of said effective source, the magnitude of the substrate-to-mask distance or the magnitude of the mask-to-source distance to direct the selected portions of said flux of material through each aperture at a controlled shift displacement onto the substrate forming a variable flux density of material at the surface of the substrate to define edges on the layer forming said pattern which extend from the extremities of the layer defining the pattern to the central portion of the layer defining the pattern wherein the thickness of the deposited layer of material decreases from the central portion of the layer to the extremities of the layer in a controlled gradient to produce an edge on the deposited layer of material having a desired edge gradient; and varying the effective source cross-sectional area and shape producing the flux of material to control the slopes of the edge gradient of the deposited layers.

2. The method of claim 1 wherein the step of aligning a substrate to a deposition mask includes the step of aligning the deposition mask from the source at a predetermined mask-to-source distance and position; and the step of registering includes the step of accurately registering the substrate from said deposition mask at a predetermined substrate-to-mask distance.

3. The method of claim 1 wherein the step of varying the cross-sectional area and shape of the effective source producing the flux of material includes the steps of reducing the effective source cross-sectional area of the effective source to increase the slope of the edge gradient of the deposited layer.

4. The method of claim 1 wherein the step of varying the cross-sectional area and shape of the effective source producing the flux of material includes the step of enlarging the effective source cross-sectional area of the effective source to decrease the slope of the edge gradient of the deposited layer.

5. The method of claim 1 wherein the step of varying the effective source cross-sectional area and shape producing the flux of material includes the step of varying the shape of the effective source such that the effective length thereof in a first direction is greater than the effective width thereof in a second direction which is substantially perpendicular to the first direction to produce a deposited layer of material in a pattern having the slope of the edge gradient in the first direction at a first selected slope which is less than the slope of the edge gradient in the second direction which is a second selected slope.

6. The method of claim 5 wherein the step of varying the effective source cross-sectional area and shape includes the step of enlarging the effective source shape in one of the first direction and the second direction to decrease the slope of the edge gradient in the enlarged direction and reducing the effective source shape in the other of the first direction and second direction to increase the slope of the edge gradient in the reduced direction.

7. A method for controlling the edge gradient of a layer of vapor deposition material deposited onto a substrate from an evaporation source of vapor deposition material comprising the steps of forming a flux of vapor deposition material having an effective source cross-sectional area and shape located at a known position from an evaporation source of a vapor deposition material;

indexing a deposition mask having a plurality of apertures extending therethrough which define a pattern for a layer of vapor deposition material to be deposited onto a substrate such that the deposition mask is in a spaced relationship from the source of vapor deposition material defining a source-to-mask distance and positioned in the flux of vapor deposition material to permit selected portions of the flux of vapor deposition material to pass through the apertures in the deposition mask;

registering a substrate in a spaced relationship from the deposition mask defining a mask-to-substrate distance to permit the selected portions of the flux of vapor deposition material passing through the apertures in the deposition mask to impinge onto the substrate to form a layer of vapor deposited material thereon having a pattern which is defined by the apertures in the deposition mask, said substrate-to-mask distance, said mask-to-source distance and said effective source cross-sectional area and shape producing the flux of vapor deposition material; and controlling the said effective source cross-sectional area and shape of said flux of vapor deposition material or the magnitude of said substrate-to-mask distance while keeping said mask-to-source distance fixed to direct the selected portions of said flux of vapor deposition material through each aperture at a controlled shift displacement onto the substrate forming a variable flux density of vapor deposition material at the surface of the substrate to define edges on the layer forming said pattern which extend from the extremities of the layer defining the pattern to the central portion of the layer defining the pattern wherein the thickness of the deposited layer of vapor deposition material decreases from the central portion of the layer to the extremities of the layer in a controlled gradient which varies the edge gradient of the deposited layer to produce an edge on the deposited layer of vapor deposition material having a desired edge gradient.

8. The method of claim 7 wherein the substrate-to-mask distance is reduced to increase the slope of the edge gradient of the deposited layer.

9. The method of claim 7 wherein the substrate-to-mask distance is increased to decrease the slope of the gradient of the deposited layer.

10. A method for controlling the edge gradient of a layer of vapor deposition material deposited onto a substrate from an evaporation source of vapor deposition material comprising the steps of forming a flux of vapor deposition material having an effective source cross-sectional area and shape located at a known position from an evaporation source of a vapor deposition material;

indexing a deposition mask having a plurality of apertures extending therethrough which define a pattern for a layer of vapor deposition material to be deposited onto a substrate such that the deposition mask is in a spaced relationship from the source of vapor deposition material defining a source-to-mask distance and positioned in the flux of vapor deposition material to permit selected portions of the flux of vapor deposition material to pass through the apertures in the deposition mask;

registering a substrate in a spaced relationship from the deposition mask defining a mask-to-substrate distance to permit the selected portions of the flux of vapor deposition material passing through the apertures in the deposition mask to impinge onto the substrate to form a layer of vapor deposited material thereon having a pattern which is defined by the apertures in the deposition mask, said substrate-to-mask distance, said mask-to-source distance and said effective source cross-sectional area and shape producing the flux of vapor deposition material;

positioning the effective source of vapor deposition at a fixed substrate-to-mask distance and a fixed mask-to-source distance; and varying the effective source cross-sectional area and shape of said flux of vapor deposition material to direct the selected portions of said flux of vapor deposition material through each aperture at a controlled shift displacement onto the substrate forming a variable flux density of vapor deposition material at the surface of the substrate to define edges on the layer forming said pattern which extend from the extremities of the layer defining the pattern to the central portion of the layer defining the pattern wherein the thickness of the deposited layer of vapor deposition material decreases from the central portion of the layer to the extremities of the layer in a controlled gradient which varies the edge gradient of the deposited layer to produce an edge on the deposited layer of vapor deposition material having a desired edge gradient.

11. The method of claim 10 wherein the step of varying the effective source cross-sectional area and shape of the flux of vapor deposition material includes the step of reducing the effective source cross-sectional area of the flux of vapor deposition material to increase the slope of the edge gradient of the deposited layer.

12. The method of claim 10 wherein the step of varying the effective source cross-sectional area and shape of the flux of vapor deposition material includes the step of enlarging the effective source cross-sectional area to decrease the slope of the edge gradient of the deposited layer.

13. A method for controlling the edge gradient of a layer of material deposited through a preformed mask onto a substrate comprising the steps of forming a flux of material to be deposited onto a said substrate wherein the flux of material has a distribution characteristic along a plurality of predetermined paths emanating from an effective source having a known cross-sectional area and shape and located at a known position;

aligning a preformed mask having a plurality of apertures extending therethrough which define a pattern for the layer of material to be deposited onto a said substrate such that the preformed mask is in a spaced relationship from said source of the flux of material defining a mask-to-source distance and positioned in said flux of material along the predetermined paths to pass through said apertures in the preformed mask;

registering a substrate in a spaced relationship from the preformed mask defining a mask-to-substrate distance to permit the selected portions of said flux of material passing through the apertures in said preformed mask to impinge onto said substrate to form a layer of material thereon having a pattern defined by the apertures in said preformed mask, the substrate-to-mask distance, the mask-to-source distance and the cross-sectional area and shape of the effective source producing the flux of material; and controlling the the cross-sectional area and shape of said effective source or the magnitude of the substrate-to-mask distance while keeping the magnitude of the mask-to-source distance fixed to direct the selected portions of said flux of material through each aperture at a controlled shift displacement onto the substrate forming a variable flux density of material at the surface of the substrate to define edges on the layer forming said pattern which extend from the extremities of the layer defining the pattern to the central portion of the layer defining the pattern wherein the thickness of the deposited layer of material decreases from the central portion of the layer to the extremities of the layer in a controlled gradient to produce an edge on the deposited layer of material having a desired edge gradient.

14. The method of claim 13 wherein the step of varying the effecitve source cross-sectional area and shape of the flux of vapor deposition material includes the step of varying the cross-sectional area and shape of the effective source such that the effective length thereof in a first direction is greater than the effective width thereof in a second direction which is substantially perpendicular to the first direction to produce a deposited layer of material in a pattern having the slope of the edge gradient in the first direction at a first slope which is less than the slope of the edge gradient in the second direction which is a second slope.

15. The method of claim 14 wherein the step of varying the effective source cross-sectional area and shape includes the step of enlarging the effective source cross-sectional length in one of the first direction and the second direction to decrease the slope of the edge gradient in the enlarged direction and reducing the effective source cross-sectional width in the other of the first direction and second direction to increase the slope of the edge gradient in the reduced direction.

16. The method of claim 13 wherein the substrate-to-mask distance is reduced to increase the slope of the edge gradient of the deposited layer.

17. The method of claim 13 wherein the substrate-to-mask distance is increased to decrease the slope of the edge gradient of the deposited layer.

18. A method for controlling the edge gradient of a layer of vapor deposition material deposited onto a substrate from an evaporation source of vapor deposition material comprising the steps of forming a flux of vapor deposition material having an effective source cross-sectional area and shape located at a known position from an evaporation source of a vapor deposition material;

indexing a deposition mask having a plurality of apertures extending therethrough which define a pattern for a layer of vapor deposition material to be deposited onto a substrate such that the deposition mask is in a spaced relationship from the source of vapor deposition material defining a source-to-mask distance and positioned in the flux of vapor deposition material to permit selected portions of the flux of vapor deposition material to pass through the apertures in the deposition mask;

registering a substrate in a spaced relationship from the deposition mask defining a mask-to-substrate distance to permit the selected portions of the flux of vapor deposition material passing through the apertures in the deposition mask to impinge onto the substrate to form a layer of vapor deposited material thereon having a pattern which is defined by the apertures in the deposition mask, said substrate-to-mask distance, said mask-to-source distance and said effective source cross-sectional area and shape producing the flux of vapor deposition material; and controlling said effective source cross-sectional area, shape of said flux of vapor deposition material and the magnitude of said substrate-to-mask distance while keeping said mask-to-source distance fixed to direct the selected portions of said flux of vapor deposition material through each aperture at a controlled shift displacement onto the substrate forming a variable flux density of vapor deposition material at the surface of the substrate to define edges on the layer forming said pattern which extend from the extremities of the layer definng the pattern to the central portion of the layer defining the pattern wherein the thickness of the deposited layer of vapor deposition material decreases from the central portion of the layer to the extremities of the layer in a controlled gradient which varies the edge gradient of the deposited layer to produce an edge on the deposited layer of vapor deposition material having a desired edge gradient.

19. A method for controlling the edge gradient of a layer of material deposited through a preformed mask onto a substrate comprising the steps of forming a flux of material to be deposited onto a said substrate wherein the flux of material has a distribution characteristic along a plurality of predetermined paths emanating from an effective source having a known cross-sectional area and shape and located at a known position;

aligning a preformed mask having a plurality of apertures extending therethrough which define a pattern for the layer of material to be deposited onto a said substrate such that the preformed mask is in a spaced relationship from a said source of the flux of material defining a mask-to-source distance and positioned in said flux of material along the predetermined paths to pass through said apertures in the preformed mask;

registering a substrate in a spaced relationship from the preformed mask defining a mask-to-substrate distance to permit the selected portions of said flux of material passing through the apertures in said preformed maks to impinge onto said substrate to form a layer of material thereon having a pattern defined by the apertures in said preformed mask, the substrate-to-mask distance, the mask-to-source distance and the cross-sectional area and shape of the effective source producing the flux of material; and controlling the cross-sectional area, shape of said effective source and the magnitude of the substrate-to-mask distance while keeping the magnitude of the mask-to-source distance fixed to direct the selected portions of said flux of material through each aperture at a controlled shift displacement onto the substrate forming a variable flux density of material at the surface of the substrate to define edges on the layer forming said pattern which extend from the extremities of the layer defining the pattern to the central portion of the layer defining the pattern wherein the thickness of the deposited layer of material decreases from the central portion of the layer to the extremities of the layer in a controlled gradient to produce and edge on the deposited layer of material having a desired edge gradient.

* * * * *